United States Patent
Tanaka et al.

(10) Patent No.: US 8,525,239 B2
(45) Date of Patent: Sep. 3, 2013

(54) SEMICONDUCTOR DEVICE AND METHOD FOR DRIVING SAME

(75) Inventors: Koutarou Tanaka, Osaka (JP); Takashi Hori, Osaka (JP); Kazuhiro Adachi, Osaka (JP)

(73) Assignee: Panasonic Corporation, Osaka (JP)

( * ) Notice: Subject to any disclaimer, the term of this patent is extended or adjusted under 35 U.S.C. 154(b) by 8 days.

(21) Appl. No.: 13/390,613

(22) PCT Filed: May 24, 2011

(86) PCT No.: PCT/JP2011/002882
§ 371 (c)(1),
(2), (4) Date: Feb. 15, 2012

(87) PCT Pub. No.: WO2011/148617
PCT Pub. Date: Dec. 1, 2011

(65) Prior Publication Data
US 2012/0176183 A1 Jul. 12, 2012

(30) Foreign Application Priority Data
May 27, 2010 (JP) ................................. 2010-121173

(51) Int. Cl.
*H01L 29/772* (2006.01)
(52) U.S. Cl.
USPC .......................................... 257/288; 438/197
(58) Field of Classification Search
USPC ........................................................ 257/288
See application file for complete search history.

(56) References Cited

U.S. PATENT DOCUMENTS

| 4,040,015 | A  * | 8/1977 | Fukuda ......................... 365/104 |
| 5,619,450 | A  * | 4/1997 | Takeguchi ................. 365/185.23 |
| 2008/0105949 | A1 | 5/2008 | Zhang et al. |
| 2008/0121993 | A1 * | 5/2008 | Hefner et al. .................. 257/341 |
| 2009/0072242 | A1 | 3/2009 | Zhang |
| 2010/0090271 | A1 | 4/2010 | Hefner et al. |
| 2011/0210378 | A1 * | 9/2011 | Ueno et al. ..................... 257/194 |

FOREIGN PATENT DOCUMENTS

| JP | 57-080775 A | 5/1982 |
| JP | 07-193234 A | 7/1995 |
| JP | 07-297295 A | 11/1995 |
| JP | 2003-031802 A | 1/2003 |
| JP | 2005-252157 A | 9/2005 |
| JP | 2008-117878 A | 5/2008 |
| JP | 2010-509771 T | 3/2010 |
| WO | 2008/020911 A2 | 2/2008 |
| WO | 2009/038610 A1 | 3/2009 |

OTHER PUBLICATIONS

International Search Report for corresponding International Application No. PCT/JP2011/002882 mailed Aug. 30, 2011.

* cited by examiner

*Primary Examiner* — Thao Le
(74) *Attorney, Agent, or Firm* — Renner, Otto, Boisselle & Sklar, LLP (57) ABSTRACT

The present invention is directed to an MIS type semiconductor device, including a channel layer between a semiconductor body region and a gate insulating film, the channel layer having an opposite semiconductor polarity to that of the semiconductor body region. Since Vfb of the semiconductor device is equivalent to or less than a gate rated voltage $Vgcc^-$ of the semiconductor device with respect to an OFF-polarity, density of carrier charge that is induced near the surface of the semiconductor body region is kept at a predetermined amount or less with a guaranteed range of operation of the semiconductor device.

10 Claims, 9 Drawing Sheets

SEMICONDUCTOR DEVICE AND METHOD FOR DRIVING SAME

TECHNICAL FIELD

The present invention relates to a semiconductor device having an MIS (Metal-Insulator-Semiconductor) structure.

BACKGROUND ART

Efforts are being made for the technological development of semiconductor devices that satisfy various required specifications according to their applications. In devices having an insulating film structure on a semiconductor substrate, there exist requirements for an improved quality of the insulating film, which will enhance their basic performances.

For example, semiconductor devices that are formed on a silicon (Si) substrate, which are generally used for LSIs, have attained higher degrees of integration through miniaturization, whereby their performances have been drastically enhanced. Conventionally, a very high quality thermally-grown oxide film (thermal $SiO_2$ film) is used as a gate insulating film thereof, and miniaturization has been made possible through the film becoming thinner, etc. Recent years have met with limitations for the thermal $SiO_2$ film to become any thinner, and for further miniaturization, high-k dielectric insulating films or the like are being introduced.

On the other hand, wide-band gap semiconductors are drawing attention as semiconductor materials for power devices which have a high breakdown voltage and in which a large current can flow. For example, silicon carbide (SIC) has a particularly high breakdown field, and therefore is expected as a semiconductor which is optimum for a next generation of low-loss power devices.

On SiC, an $SiO_2$ film with a relatively good quality can be formed through thermal oxidation. However, its MIS interface will contain defects associated with many thermal $SiO_2$ films, e.g., interface state, and the very low channel mobility of MIS transistors and difficulties to attain reliability have presented a problem. On the other hand, reports have been made in the recent years that, after a thermal oxide film is formed or an $SiO_2$ film is formed via CVD, a nitriding treatment step may be introduced to dope the $SiO_2$/SiC interface with a high concentration of nitrogen, thus reducing the interface state and improving the channel mobility.

For example, Patent Document 1 discloses a production method which involves a step of performing a nitriding treatment for an SiC surface in an ambient that contains an NO gas or $N_2O$ gas, and, following the nitriding treatment step, a step of performing film formation on the SiC surface by a chemical or physical vapor phase epitaxy technique.

An MIS interface that involves a gate insulating film which is formed through any such process is proven to have a reduced interface state and a considerably improved channel mobility.

CITATION LIST

Patent Literature

[Patent Document 1] Japanese Laid-Open Patent Publication No. 2008-117878

SUMMARY OF INVENTION

Technical Problem

There is an annually increasing technological difficulty for reconciling enhancement of the basic performance of semiconductor devices and ensurement of reliability.

For example, in MIS type semiconductor devices formed on Si, or MISFET transistor devices (MIS Field-Effect-Transistors), the internal electric field is on a continuous increase due to progresses in miniaturization and the like. This allows the carriers within the semiconductor to acquire more energy and ride over the insulating film barrier, and so on, to become more likely to be introduced into the gate insulating film, thus causing various reliability problems such as fluctuations and instability of the threshold voltage (Vth). Among the carriers to be introduced into a gate insulating film, i.e., electrons and holes, it is well known that the latter incurs a far greater amount of occurred damage such as traps (which may be referred to as trap efficiency, etc.) per introduced carrier, than does the former.

Furthermore, the progresses in miniaturization and the trend toward thinner films have made it imperative in recent Si integrated circuit devices that a high-k dielectric insulating film be used as the gate insulating film, instead of the conventional thermal $SiO_2$ film. As compared to conventional thermal $SiO_2$ films, which are known to have a very high quality, such high-k dielectric insulating films are not only much inferior in film quality, but they also generally have a small energy gap, which makes the energy barrier as viewed from the carriers within the semiconductor correspondingly lower. A deteriorated film quality increases trap efficiency, and a decreased energy barrier increases the probability that electrons and holes may be introduced into the insulating film. This is expected to worsen the reliability problems, such as Vth fluctuations, in semiconductor devices in which such high-k dielectric insulating films are used.

On the other hand, in an MISFET which is made of a wide-band gap semiconductor, the semiconductor side has a wide-band gap; therefore, even when $SiO_2$ having a wide-band gap is used as the gate insulating film, the barrier height with respect to the semiconductor will be lower. As a result of this, carriers within the semiconductor are more likely to be introduced into the insulating film.

Figure 9:
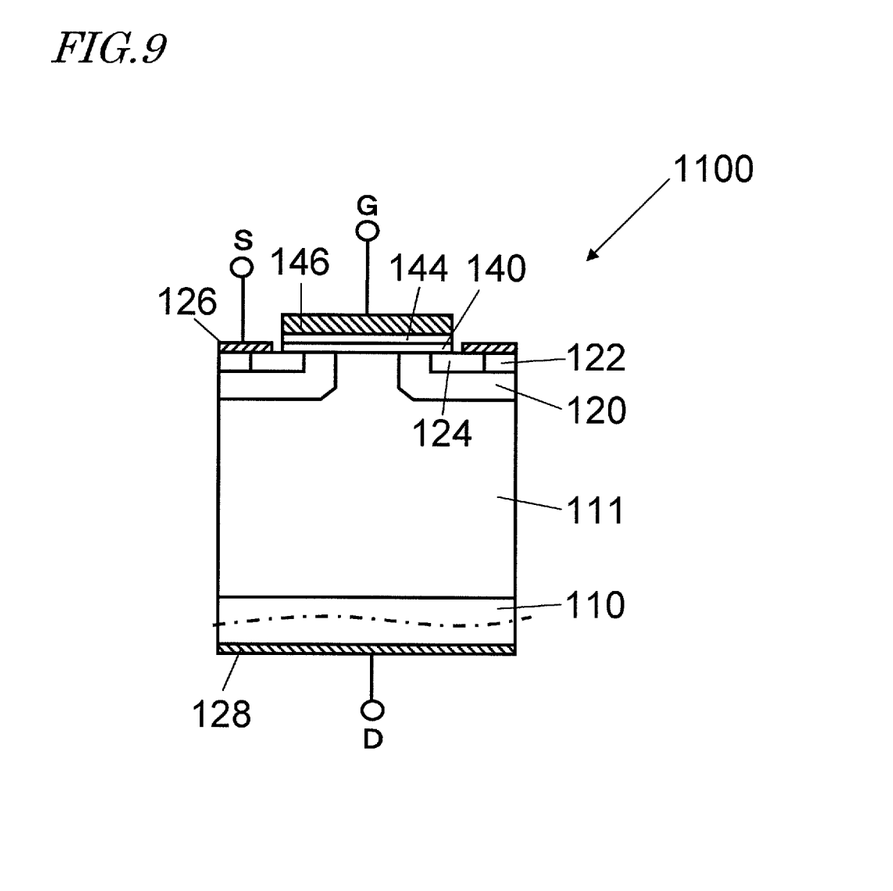

FIG. 9 shows an exemplary constitution of an SiC semiconductor device 1100 having a vertical MIS structure. The semiconductor device 1100 has a structure such that an n⁻ drift layer 111 is stacked on an n⁺ substrate (SiC substrate) 110. A p body region 120 is formed in an upper portion of the n⁻ drift layer 111, and a p body contact region 122 and an n⁺ source region 124 are formed in an upper portion of the p body region 120. A channel layer 140 is formed on the surface of the n⁻ drift layer 111, the p body contact region 122, and the n⁺ source region 124. Further upon the channel layer 140, a gate insulating film 144 and a gate electrode 146 are formed. In the channel layer 140, a channel region is formed in a place located above the p body region 120. This "channel layer" may also be referred to as a "buried layer". A source electrode 126 is formed on the surface of the n⁺ source region 124, and a drain electrode 128 is formed on a rear face of the n⁺ substrate 110.

Generally speaking, for any equipment, devices, parts, and the like, ratings (or "maximum ratings") are defined, which dictate specifications, performance, usage limits, and the like under designated conditions, such that the device is guaranteed to perform a normal operation, including long-term reliability, when used within the bounds of such rated values. On the other hand, an "absolute maximum rating" refers to a value which should not be exceeded at any time, or otherwise perpetual destruction or the like will result. Therefore, generally larger ranges are defined for "absolute maximum ratings" than for "ratings" or "maximum ratings". Hereinafter, the present specification will employ terms like ratings (maximum ratings) and absolute maximum ratings.

In an MIS type semiconductor device, a rated voltage Vgcc is defined for the gate, such that operation is guaranteed for both polarities of positive voltage and negative voltage, generally speaking. In the present specification, a gate rated voltage for the ON-polarity of an MIS type semiconductor device is defined as Vgcc. Moreover, a gate rated voltage for the OFF-polarity of an MIS type semiconductor device is defined as Vgcc⁻. By taking an n channel MIS type semiconductor device for instance, which is commonly used in power semiconductors, Vgcc is generally a range of 20±2 V, for example. As for the positive gate voltage Vg on the ON side, operation is guaranteed in a range whose upper limit is Vgcc. On the other hand, as for the negative gate voltage on the OFF side, operation is guaranteed in a range whose lower limit is Vgcc⁻. Generally speaking, depending on the semiconductor device as well as its applications, operation is guaranteed in a range whose lower limit is from −Vgcc to −Vgcc/2. In other words, generally speaking, Vgcc⁻ is set in a range from −Vgcc to −Vgcc/2. This also applies to SiC power semiconductors. In the case where Vgcc=20 V, for example, operation must be guaranteed, including reliability, in a range from −20 to −10 V≦Vg≦+20 V.

The inventors have found that, when such a high voltage is applied to a gate insulating film, a phenomenon is observed where, under certain conditions, the threshold voltage (Vth) becomes unstable and fluctuates over time. In particular, it has been made clear by the inventors that a remarkable shift in the negative direction occurs due to application of a negative voltage at a high temperature.

The present invention has been made in view of the above circumstances, and a main objective thereof is to provide a semiconductor device which suppresses the phenomenon in which Vth fluctuates over time.

Solution to Problem

A semiconductor device according to the present invention is a semiconductor device of an MIS type, comprising: a semiconductor body region; a gate insulating film; a channel layer provided between the semiconductor body region and the gate insulating film, the channel layer having an opposite semiconductor polarity to that of the semiconductor body region; and a gate electrode provided so as to be in contact with the gate insulating film, wherein, a gate voltage at which a band bending of the semiconductor body region becomes zero is defined as a flatband voltage Vfb, and a rated voltage for a gate of the semiconductor device with respect to an OFF-polarity is defined as Vgcc⁻, such that Vfb of the semiconductor device is equivalent to or less than Vgcc⁻.

In one embodiment, a band gap of the semiconductor body region is defined as Eg, and a rated voltage for the gate of the semiconductor device with respect to an ON-polarity is defined as Vgcc, such that Vfb of the semiconductor device is equivalent to or less than a lower one of −Vgcc/2 and −2Eg.

In one embodiment, a gate insulating film capacitance of the semiconductor device is defined as Ci, such that the channel layer has a semiconductor impurity concentration which is greater than $10^{18}$ cm$^{-3}$ but equal to or less than $5 \times 10^{19}$ cm$^{-3}$, and a semiconductor impurity charge concentration per area which is equivalent to or more than Eg×Ci [C/cm²].

In one embodiment, a gate insulating film capacitance of the semiconductor device is defined as Ci, and a fixed charge density associated with the gate insulating film is defined as Qf, such that Qf is equivalent to or more than 1.5Eg×Ci [C/cm²].

In one embodiment, a gate insulating film capacitance of the semiconductor device is defined as Ci, a fixed charge density associated with the gate insulating film is defined as Qf, and a work function difference between the semiconductor body region and the gate electrode is defined as Φms, such that Qf−Φms×Ci has a value which is equivalent to or more than 2Eg×Ci [C/cm²].

In one embodiment, a gate insulating film capacitance of the semiconductor device is defined as Ci, a semiconductor impurity charge concentration of the channel layer per area is defined as Qb, and a work function difference between the semiconductor body region and the gate electrode is defined as Φms, such that the channel layer has a semiconductor impurity concentration which is greater than $10^{18}$ cm$^{-3}$ but equal to or less than $5 \times 10^{19}$ cm$^{-3}$, and Qb−Φms×Ci has a value which is equivalent to or more than 2Eg×Ci [C/cm²].

In one embodiment, the semiconductor body region and the channel layer are composed of silicon carbide.

In one embodiment, Vfb is equal to or less than −10 volts (V).

A driving method for a semiconductor device according to the present invention is a driving method for a semiconductor device of an MIS type having a semiconductor body region, a gate insulating film, a channel layer provided between the semiconductor body region and the gate insulating film, the channel layer having an opposite semiconductor polarity to that of the semiconductor body region, and a gate electrode provided so as to be in contact with the gate insulating film, the driving method comprising: a step of applying a voltage of a magnitude between Vth and Vgcc⁻ to the gate electrode, where a gate voltage at which a band bending of the semiconductor body region becomes zero is defined as flatband voltage Vfb, a rated voltage for a gate of the semiconductor device with respect to an OFF-polarity is defined as Vgcc⁻, a rated voltage for the gate of the semiconductor device with respect to an ON-polarity is defined as Vgcc, and a threshold voltage of the semiconductor device is defined as Vth; and a step of applying a voltage of a magnitude between Vth and Vgcc to the gate electrode, wherein Vfb of the semiconductor device is equivalent to or less than Vgcc⁻.

In one embodiment, a band gap of the semiconductor body region is defined as Eg, such that Vfb of the semiconductor device is equivalent to or less than a lower one of −Vgcc/2 and −2Eg.

Advantageous Effects of Invention

According to the present invention, since Vfb is set to be substantially equivalent to or less than Vgcc⁻, the phenomenon of fluctuating Vth is avoided, which is a problem when a high voltage corresponding to the lower limit or the upper limit, etc., of a rated voltage is applied to the gate electrode.

DESCRIPTION OF EMBODIMENTS

Presumably, the phenomenon where the threshold voltage (Vth) becomes unstable and fluctuates over time under certain conditions occurs because, due to the presence of a high density of hole traps at an $SiO_2$/SiC interface or its neighboring $SiO_2$ film, holes are captured by the above traps. Based on the findings described below, the present invention sets a flatband voltage Vfb that is substantially equivalent to or less than Vgcc⁻ (which typically is −Vgcc or −Vgcc/2), i.e., the lower limit of a guaranteed range for gate voltage, whereby Vth fluctuations can be suppressed. Hereinafter, the relationship between Vth fluctuations and Vfb will be described.

Wide-band gap materials, particularly SiC, have a low hole barrier of about 2.9 V with respect to $SiO_2$, as compared to that of Si, which is about 4.7 V. Therefore, even if the number of traps (or trap efficiency) for holes is about the same as that of an Si semiconductor, it is expected that there is a large total amount of holes injected into $SiO_2$. In fact, it is generally known that SiC semiconductors have more hole traps with respect to an $SiO_2$ film than do Si semiconductors.

Figure 2:
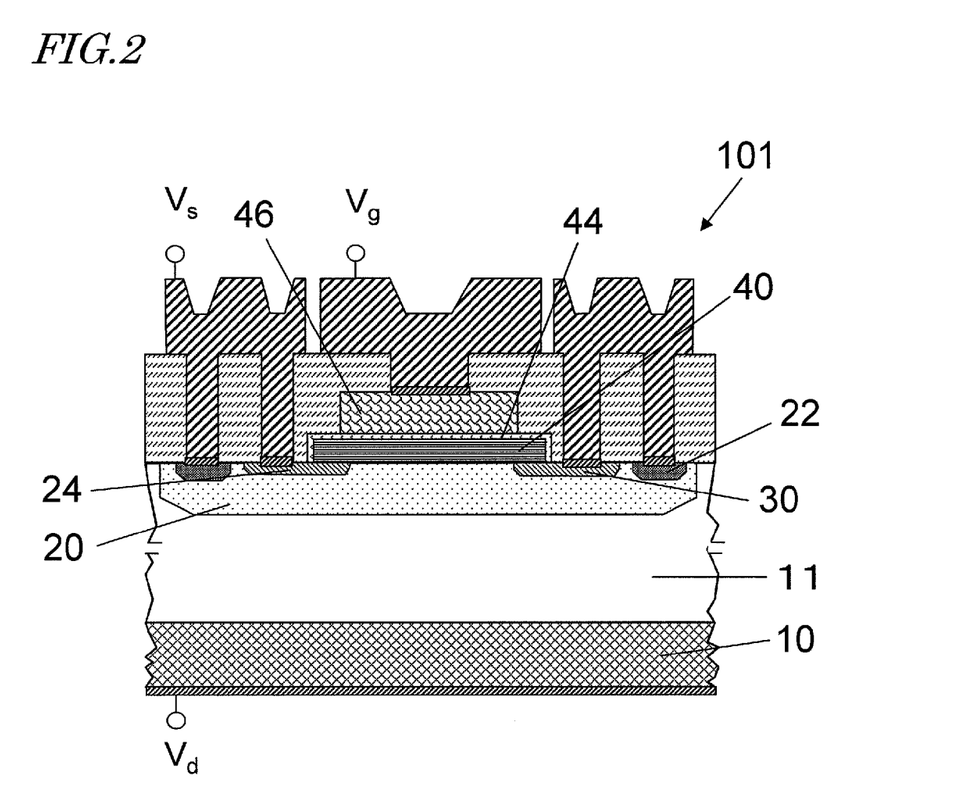

In order to analyze the mechanism behind this phenomenon of Vth fluctuations, the inventors have conducted a representative experiment as described below. First, an SiC-MISFET 101 of a lateral type as shown in FIG. 2 is provided. This lateral MISFET includes an SiC semiconductor substrate 10 and an n⁻ type drift layer 11 formed on the SiC semiconductor substrate 10. A p type body region 20 exists on the upper face side of the n⁻ type drift layer 11, and in the p type body region 20, a source region 24 and a drain region 30, which are n types, are formed so as to be spaced apart. On the p type body region 20, a channel layer 40 (or buried layer) is disposed so as to partially overlap the source region 24 and the drain region 30. On the channel layer 40, a gate insulating film 44 and a gate electrode 46 are disposed in this order. This lateral MISFET is basically identical to the vertical MISFET shown in FIG. 9, except that the n type source region 24 and the drain region 30 are symmetric with respect to the gate electrode 46. This lateral MISFET was observed for a phenomenon in which the Vth when applying a voltage to the gate electrode changes over time.

Figure 3:
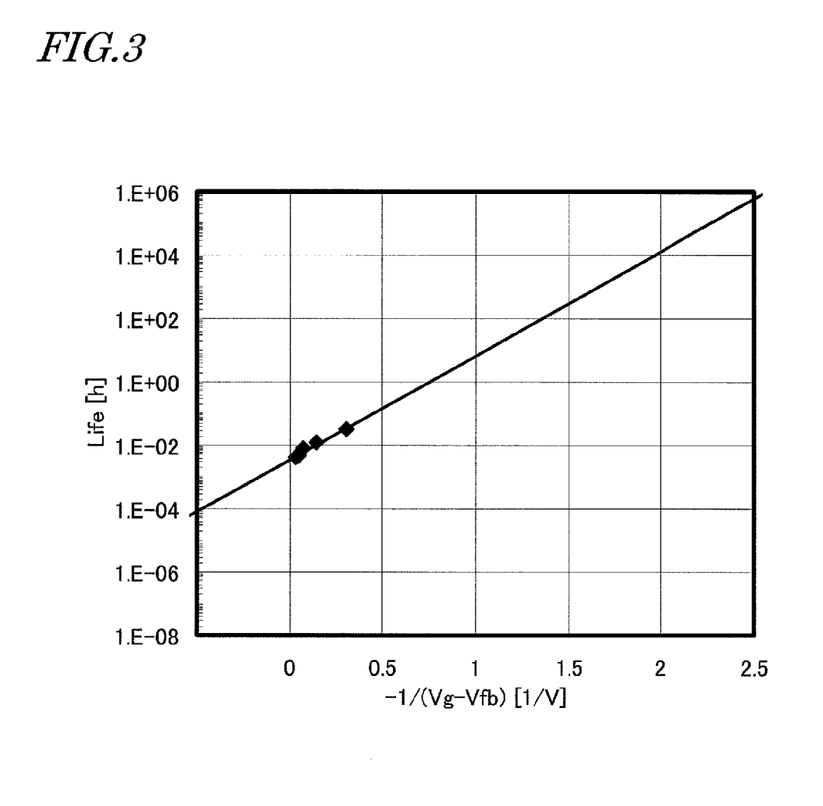

FIG. 3 shows voltage dependence of a Vth lifetime when a negative voltage (Vg) is applied to a gate electrode at a high temperature of 150° C. In the graph of FIG. 3, the vertical axis represents lifetime, and the horizontal axis represents a value which is obtained by subtracting Vfb from the gate voltage Vg and multiplying an inverse of the resultant value by minus one. The lifetime, as used herein, is an amount of time in which the fluctuation amount of Vth reaches ±0.3 V, which corresponds to 10% fluctuation. It became clear through extrapolation from the figure that, in order to guarantee 10 years (87600 hours≈about $1\times10^5$ h) of lifetime, the value on the horizontal axis of the figure must exceed 2. In other words, it is necessary that −1/(Vg−Vfb) exceeds 2. From this, it follows that Vfb−Vg<0.5.

It becomes through the above discussion that, generally speaking, Vg>Vfb−Vo needs to be satisfied in order to guarantee a sufficiently long lifetime. Herein, the value of Vo is very small, i.e., approximately 0.5 V in this example. Vfb is a flatband voltage of the semiconductor device. The flatband voltage Vfb is defined as a gate voltage at which a semiconductor body region having a channel layer on its side facing a gate insulating film (i.e., the p type body region 20 in the exemplary structure of FIG. 2) has zero band bending.

Figure 6:
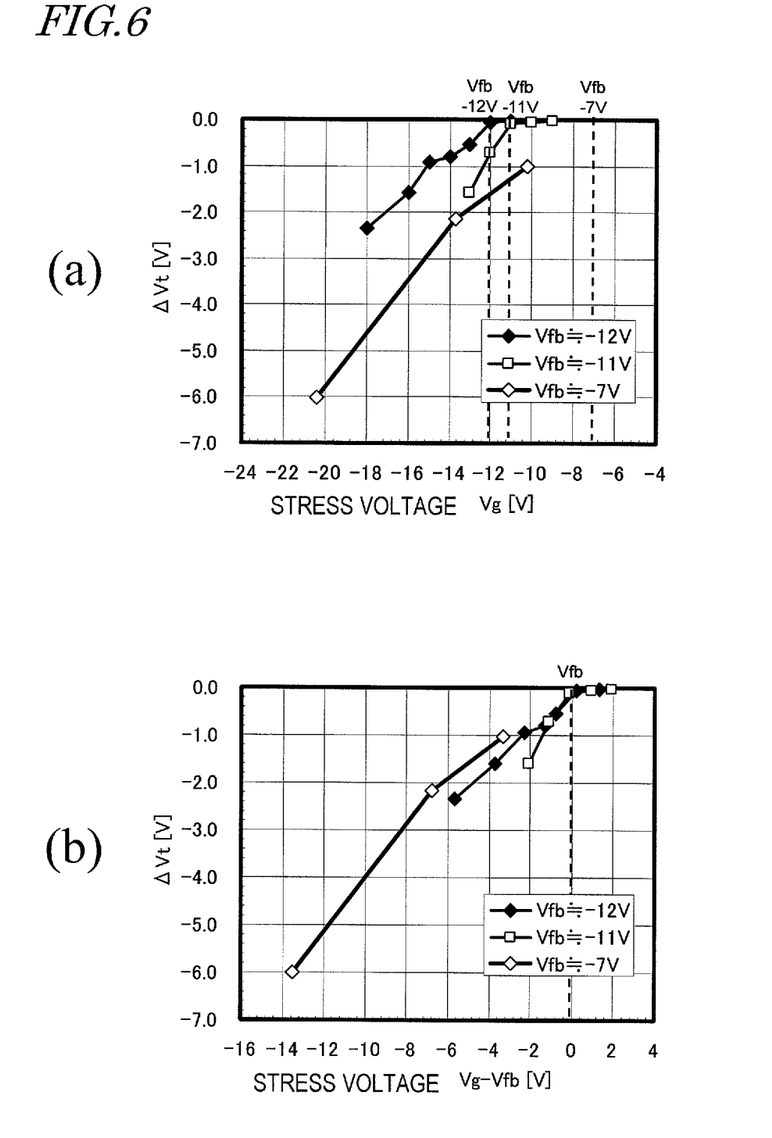

Vo can be put in the generalized expression Vo=Qo/Ci. Herein, Ci is a gate insulating film capacitance per unit area; and Qo is an amount of charge per unit area, where Vo is normalized by Ci. Thus, the inventors have found that a Vth shift amount in the negative direction when applying a negative voltage to the gate electrode is generally determined on the basis of an amount by which Vg is shifted from Vfb in the negative direction (i.e., how much lower in terms of positive/negative on a number line). This aspect will be described later in more detail with reference to (*a*) and (*b*) of FIG. 6.

The inventors' idea of the mechanism of the negative direction shift of Vth is as follows. That is, carriers (which in this case are holes) that are induced near the semiconductor surface are introduced into the gate insulating film through a process such as thermal excitation. It has been confirmed through simulations and the like that, in an MIS type semiconductor device of Si, SiC, or the like having a conventional channel layer, most of the channel layer is depleted, especially when the gate voltage is negative. The positive charge which is generated at this time is a space charge, and therefore is not able to move into the insulating film. Only after the p type semiconductor body region takes an accumulation state does the positive carrier that is able to move into the gate insulating film increase in proportion to |Vg−Vfb|. Therefore, it is basically believed that the aforementioned Qo is an amount obtained by multiplying a density of carrier charge which is induced near the surface of the semiconductor body region by an injection efficiency into the gate insulating film and a trap efficiency at the gate insulating film, and is something of a threshold beyond which Vth fluctuations are caused.

As in the above example, in a wide-band gap semiconductor such as SiC, it is still difficult to obtain a high-quality interface between the gate insulating film and the semiconductor, and the semiconductor being wide-band gapped makes for a lower injection barrier into the gate insulating film. In other words, based on the mechanism discussed above, it is still difficult to keep the trap efficiency and the like sufficiently low, and also there is a high injection efficiency into the gate insulating film according to natural principles. Therefore, wide-band gap semiconductors have various reliability problems which are even more serious than those of Si semiconductors, and which are waiting to be solved.

According to the present invention, within a guaranteed range of operation of the semiconductor device, the density of carrier charge induced near the surface of the semiconductor body region is kept at a predetermined amount or lower. In the past, there was practically no semiconductor device such that, in the guaranteed range of operation of the semiconductor device (which herein is the guaranteed range on the negative gate voltage side in particular), the density of carrier charge that is induced near the surface of the semiconductor body region stays at a predetermined amount or less, i.e., Vfb is substantially equivalent to or less than the lower limit (which typically is −Vcc, or may alternatively be −Vcc/2) of the guaranteed range. The reason is that, as will be described below: it is difficult to set Vfb to be substantially equivalent to or less than the lower limit of the guaranteed range; or, doing so would cause various disadvantages, and no advantages which surpass such disadvantages have hitherto been known to exist. Thus, prior to the present invention, there was no motivation for or concept of setting Vfb at a value which is lower than the conventional values.

Hereinafter, the constitution of a semiconductor device in which Vfb is set to be substantially equivalent to or less than the lower limit of a guaranteed range for gate voltage on the negative side will be described. In the present specification, being "equivalent" to a given value means having an magnitude which falls within ±10% of that value.

In a semiconductor device having an MIS structure including a channel layer between a gate insulating film and a semiconductor body region, stated simply, Vfb of the semiconductor device is expressed by the following equation.

$$Vfb = \Phi ms - (Qf + Qb)/Ci \quad \text{(eq. 1)}$$

Φms is a work function difference between the gate electrode and the semiconductor body region; Qf is a fixed charge density associated with the gate insulating film; Qb is a space charge density of the channel layer; and Ci is a gate insulating film capacitance.

Φms in the first term is determined by a vacuum work function of the gate electrode material. For example, in the case of Si, where doped polysilicon is usually used for the gate electrode, it is approximately in the range of $-1.1 \text{ V} \leq \Phi ms \leq +1.1 \text{ V}$, depending on the polarity and concentration of the dopant. Herein, 1.1 V is a band gap value of Si semiconductors. In the case of SiC, usually, $n^+$ doped polysilicon, aluminum, or the like is used for the gate electrode. Therefore, in the case of 4H—SiC, whose band gap value Eg is about 3.2 V, it is approximately in the range of $-3.2 \text{ V} \leq \Phi ms \leq +0.2 \text{ V}$. In other gate electrode materials, too, those materials which are put to practice use from the standpoint of performance and reliability have vacuum work functions that are generally in the range from 4 V to 5.3 V. Thus, regardless of the kind of semiconductor, Φms is equivalent to the band gap of Si, or lower. In the present specification, volts (V) will consistently be used as the unit for band gap Eg and work function difference Φms.

On the other hand, Qf in the second term is greatly affected by the quality of the interface between the gate insulating film and the semiconductor. Since reduction in Qf directly enhances the performance and reliability of that semiconductor device, efforts to reduce Qf have been made in the past. Among others, in the case of Si, Qf has been reduced to very low values by using a high-quality thermal $SiO_2$ film as the gate insulating film. Specifically, when expressed in a unit which is obtained by dividing Qf by an elementary charge q, it has been reduced to below $10^{11}/cm^2$. On the other hand, in the case of SiC, it is difficult to obtain a high-quality gate insulating film, and even if a nitriding treatment is performed, for example, the current norm is that Qf is in the middle of $10^{11}/cm^2$'s (roughly speaking, about 3 to $5 \times 10^{11}/cm^2$). In either case, since the Qf value is directly connected to the general performance and reliability of the semiconductor device, efforts of reducing Qf have conventionally been made, and there has been no motivation to enhance Qf.

In summary of the above, the value of Φms−Qf/Ci, i.e., a sum of the first term and the second term, is determined by the material composing the MISFET, and its value is in a range of magnitude which is on the order of the band gap of the semiconductor composing the MISFET.

On the other hand, Qb in the third term is a space charge density per unit area of the channel layer provided under the gate insulating film. For example, in the case of an n type channel layer in an Si or SiC semiconductor, under a negative gate voltage, what corresponds to the aforementioned space charge density is a value obtained by allowing the semiconductor impurity concentration as stored across the entire channel layer, or across the entire depletion layer if the depletion layer thickness in the channel layer is less than the channel layer thickness, to be multiplied by the elementary charge q. Unlike the first term and second term, Qb is basically free from constraints on physical material properties, but in actuality cannot be made very large because there are constraints on device operation designs. If it is made too large, punch-through, short channel effects, and the like will become outstanding, for example, thus making even the basic operation of the semiconductor device precarious. Therefore, in a p channel Si-MISFET having a gate electrode of $n^+$ polysilicon, for example, even the channel layer which has previously been often adopted in order to maintain an n/p channel symmetry of Vth, had to be confined to introducing only a channel layer with as small an amount of space charge as possible, in order to be able to minimize these problems. Therefore, generally speaking, the conventional value of Qb/Ci is kept to about the band gap of the semiconductor or less. For example, in the conventional example of a vertical MIS structure of SiC semiconductor shown in FIG. 9, the Qb/Ci value is about 3.1 V. This is equivalent to or less than the Eg value of 4H—SiC semiconductors, i.e., 3.2 V.

Figure 4:
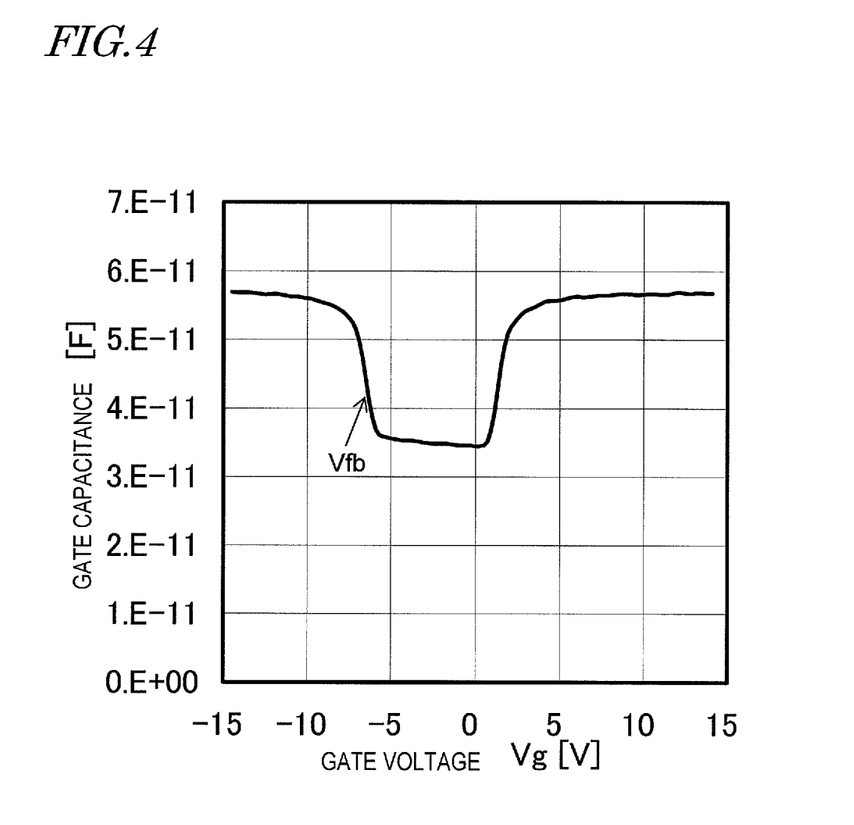

Thus, it is generally the case that Vfb, as a sum of all of the terms, is approximately in a range of magnitude which is on the order of twice the band gap Eg of the semiconductor composing the semiconductor device, irrespective of whether the semiconductor device has a channel layer or not. For example, in the conventional example of a vertical MIS structure of SiC semiconductor having Eg=3.2 V, it is usually the case that Vfb is about −6.5 V or more (meaning, equivalent thereto or having a more positive value therefrom; the same will also apply elsewhere) as indicated by an arrow in FIG. 4. Vgcc of this device is generally about 20 V. Therefore, the Vfb value of the aforementioned conventional example is much higher than −Vgcc to −Vgcc/2.

Hereinafter, with reference to the drawings, embodiments of the semiconductor device according to the present invention will be described. The present invention is not limited to the following embodiments.

First Embodiment

With reference to a schematic cross-sectional view of FIG. 1, a semiconductor device 100 according to an exemplary embodiment of the present invention will be described.

Figure 1:
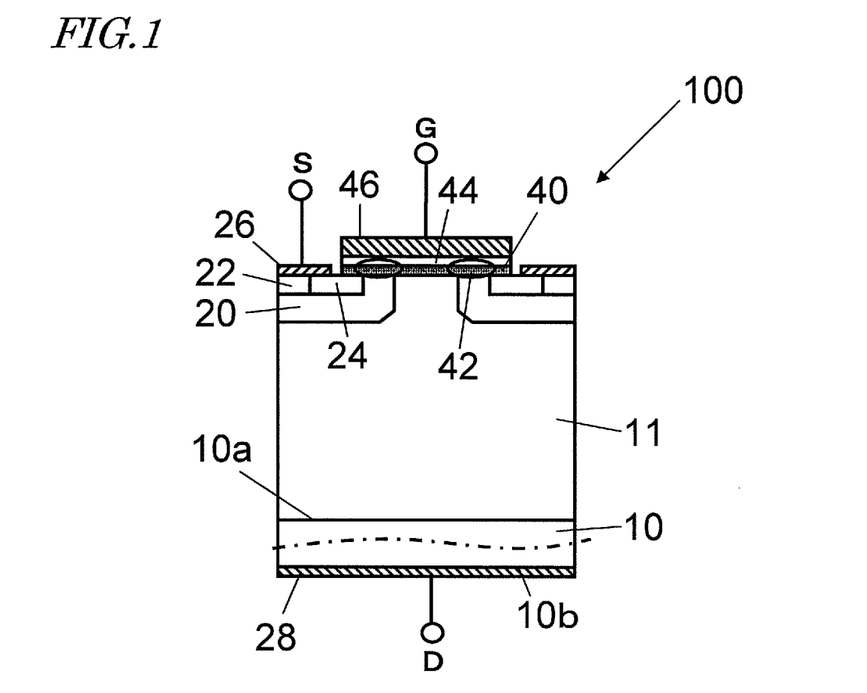
FIG. 1 A cross-sectional view of a semiconductor device (SiC vertical MISFET) 100 according to an embodiment of the present invention FIG. 2 A cross-sectional view of another semiconductor device (SiC lateral MISFET) 101 according to the present embodiment FIG. 3 A diagram showing voltage dependence of a Vth lifetime of an SiC lateral MISFET according to a conventional example FIG. 4 A diagram showing CV characteristics of an SiC MIS type semiconductor device according to a conventional example FIG. 5 A diagram showing CV characteristics of an SiC lateral MISFET according to the present embodiment FIG. 6 (*a*) is a diagram showing stress voltage dependence of Vth fluctuation amounts of SiC lateral MISFETs having different Vfb's; and (*b*) is a diagram showing a comparison of Vth fluctuation amounts when Vfb is subtracted from the stress voltage applied to the semiconductor devices having different Vfb's FIG. 7 A diagram showing voltage dependence of Vth lifetimes of SiC lateral MISFETs having different Vfb's FIG. 8 A cross-sectional view schematically showing the constitution of a semiconductor device 102 according to another embodiment of the present invention FIG. 9 A cross-sectional view of a semiconductor device (SiC vertical MISFET) 1100 according to a conventional example

The semiconductor device 100 shown in FIG. 1 is an example of a silicon carbide (hereinafter, SiC) power semiconductor device of a vertical MIS structure. The semiconductor device 100 includes an SiC semiconductor substrate 10 of a first conductivity type, and a first SiC semiconductor layer 11 of the first conductivity type formed on a surface 10a of the substrate 10. In the present embodiment, the SiC semiconductor substrate 10 is an $n^+$ substrate ($n^+$ SiC substrate), whereas the first SiC semiconductor layer 11 is an $n^-$ drift layer. In other words, in the present embodiment, the first conductivity type is the n type, and the second conductivity type is the p type. The n type and the p type are interchangeable. In the "$n^+$" or "$n^-$" notation, the superscript "+" or "−" expresses a relative concentration of the dopant: "$n^+$" means a higher n type semiconductor impurity concentration than "n"; and "n−" means a lower n type semiconductor impurity concentration than "n".

On the first SiC semiconductor layer 11, a body region (well region) 20 of the second conductivity type is formed. In the body region 20, a source region 24 of the first conductivity type is formed. In the present embodiment, the body region 20 is a p type, whereas the source region 24 is an n+ type. In the body region 20, a p type contact region 22 is formed. A source electrode 26 is formed on the source region 24. In the present embodiment, the source electrode 26 is formed on the surface of the n+ source region 24 and the p contact region 22, and is in electrical contact with both of the n+ source region 24 and the p contact region 22; however, it may be in contact with each one of them separately. Moreover, the present invention applies to any MIS type structure; other than an FET, the present invention is also applicable to a so-called MIS capacitor, which lacks a source and a drain.

On the first SiC semiconductor layer 11, a SiC semiconductor channel layer 40 of the first conductivity type is formed in contact with the p body region 20 and at least a portion of the n+ source region 24. The channel layer 40 in the present embodiment is formed through epitaxial growth on the n− drift layer 11 having the p body region 20 and the n+ source region 24 formed thereon. The channel layer 40 includes a channel region 42 in a place located above the p body region 20. A gate insulating film 44 is formed on the channel layer 40. A gate electrode 46 is formed on the gate insulating film 44. A drain electrode 28 is formed on a rear face 10b of the substrate 10.

In the present embodiment, the channel layer 40 has a semiconductor impurity concentration of $2.5 \times 10^{18}$ cm$^{-3}$, and its thickness is 30 nm. Usually, a channel layer is mostly depleted, especially under a negative gate voltage. Therefore, the value of space charge density Qb is calculated to be $12 \times 10^{-7}$ C/cm$^2$ from a mathematical product of the semiconductor impurity concentration, the thickness, and q. As a rough calculation based on depletion approximation, when the semiconductor impurity concentration Nb is too dense, depletion will not occur across the entire channel layer in the above example and therefore a maximum depletion layer thickness $Wm = 2(\in s * \Phi f/q/Nb)^{1/2}$ may be used instead of the channel layer of the thickness. Herein, $\in s$ is a dielectric constant of the semiconductor; and $\Phi f$ is a Fermi level of the semiconductor. For example, in the present embodiment, it roughly holds that Wm=41 nm when Nb=$2 \times 10^{18}$ cm$^{-3}$, and Wm=18 nm when Nb=$1 \times 10^{19}$ cm$^{-3}$.

The aforementioned simple analytic expression is based on the assumption that the semiconductor impurity concentration is uniform along the thickness direction. If the semiconductor impurity concentration in the channel layer is non-uniform, strictly speaking, it is impossible to analytically determine the value of space charge density Qb. However, even in this case, Qb may be determined from an integral of the semiconductor impurity concentration profile that is taken across the depletion layer. On the other hand, the gate insulating film 44 in the present embodiment is a nitrided oxide film having a thickness of 70 nm, whose gate insulating film capacitance Ci is $4.9 \times 10^{-8}$ F/cm$^2$. Therefore, from (eq. 1), a shift amount in Vfb which is caused by Qb is roughly calculated to be −24 V.

In the present embodiment, since n+ polysilicon is used for the gate electrode and the semiconductor body region 20 has a semiconductor impurity concentration of $2 \times 10^{18}$ cm$^{-3}$, the work function difference $\Phi ms$ is about −3 V. Moreover, the shift amount in Vfb which is caused by Qb is about −1 V. Therefore, by substituting the above exemplary values (calculated values) into the right-hand side of (eq. 1), Vfb of the present embodiment is roughly calculated to be about −28V.

Note that the semiconductor impurity concentration of the semiconductor body region 20 does not refer to the semiconductor impurity concentration in a transitional region with any other semiconductor region, but refers to the semiconductor impurity concentration at a position which is sufficiently distant from a transitional region with any other semiconductor region. The semiconductor impurity concentration changes steeply with position in a transitional region; however, at a position which is sufficiently distant from the transitional region, the semiconductor impurity concentration does not change very much with position. For example, it refers to the semiconductor impurity concentration in the neighborhood of the surface of the body region 20 around the center of the body region 20 along the lateral direction in FIG. 1 according to the present embodiment, which is distant from the first SiC semiconductor layer 11 and from the source region 24 and in which the concentration profile is stable. Similarly, in the lateral MOS embodiment of FIG. 2, it commonly refers to the semiconductor impurity concentration around a middle position between both regions 24 and 30, which is sufficiently distant from the source region 24 and from the drain region 30. Moreover, in a channel epitaxial layer such as that of the present embodiment, its semiconductor impurity concentration basically does not change along the lateral direction. It is assumed that the semiconductor impurity concentration in the channel layer of the present embodiment refers to the semiconductor impurity concentration at a position directly above a lateral position at which the semiconductor impurity concentration of the body region 20 is defined.

Figure 5:
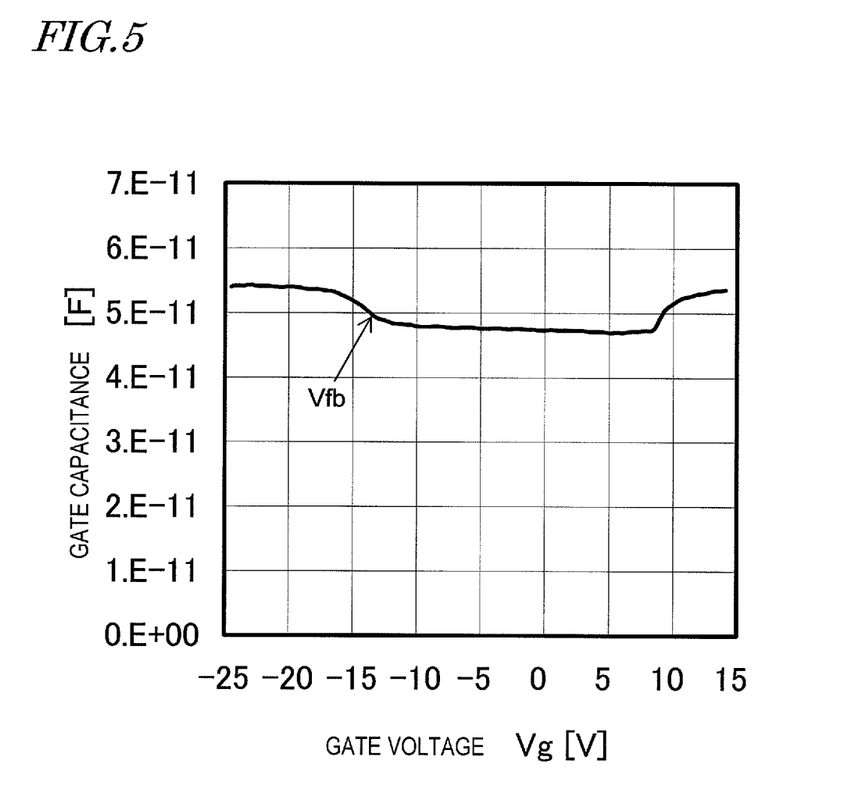

FIG. 5 shows an exemplary measurement of C-V characteristics of the semiconductor device 100 of the present embodiment. Vfb in this exemplary measurement (indicated at an arrow in the figure) is estimated to be about −13 V, which value is considerably higher than the aforementioned calculated value. On the other hand, in FIG. 4, which is directed to the above-illustrated conventional example, Vfb for the same exemplary measurement reads about −7 V, which substantially coincides with the value of Vfb which is calculated from the Qb value of $1.6 \times 10^{-7}$ C/cm$^2$ of the channel layer in the conventional example. The main cause for this has been found to be that the total amount of impurity that was actually introduced into the channel layer had decreased from its target value in some step during the manufacturing of the semiconductor device, mainly because the thickness of the channel layer was reduced in manufacturing the present embodiment, and so on. As calculated back from the Vfb value which is determined from FIG. 5, the actual Qb value in this example is about $5 \times 10^{-7}$ C/cm$^2$. As can be seen from the above, it has been confirmed that Vfb can be shifted greatly in the negative direction by increasing the semiconductor impurity concentration in the channel layer, and so on, to increase the space charge density thereof.

As mentioned earlier, in an SiC power device whose gate rated voltage Vcc=20 V, operation and reliability must be guaranteed in a range from −20 to −10 V≦Vg≦+20 V, generally speaking.

FIG. 6(a) shows negative voltage dependence of Vth when a negative voltage (Vg) is applied for 16 min. as a stress voltage to lateral MISFETs having characteristics such that Vfb≈−7V, −11 V, −12 V, at a high temperature of 150° C. FIG. 6(b) shows negative voltage dependence of Vth, where the comparison is made after subtracting Vfb from the stress voltage.

As can be seen from FIG. 6(b), in lateral MISFETs with different Vfb's, too, no Vth fluctuations are observed when Vg is equal to or greater than Vfb; but when Vg is lower than Vfb, changes over time are observed such that Vth fluctuates in the negative direction. Thus, it has been confirmed that the fluctuation amount of Vth in the negative direction depends on how much shifted in the negative direction the voltage Vg is with respect to Vfb.

Figure 7:
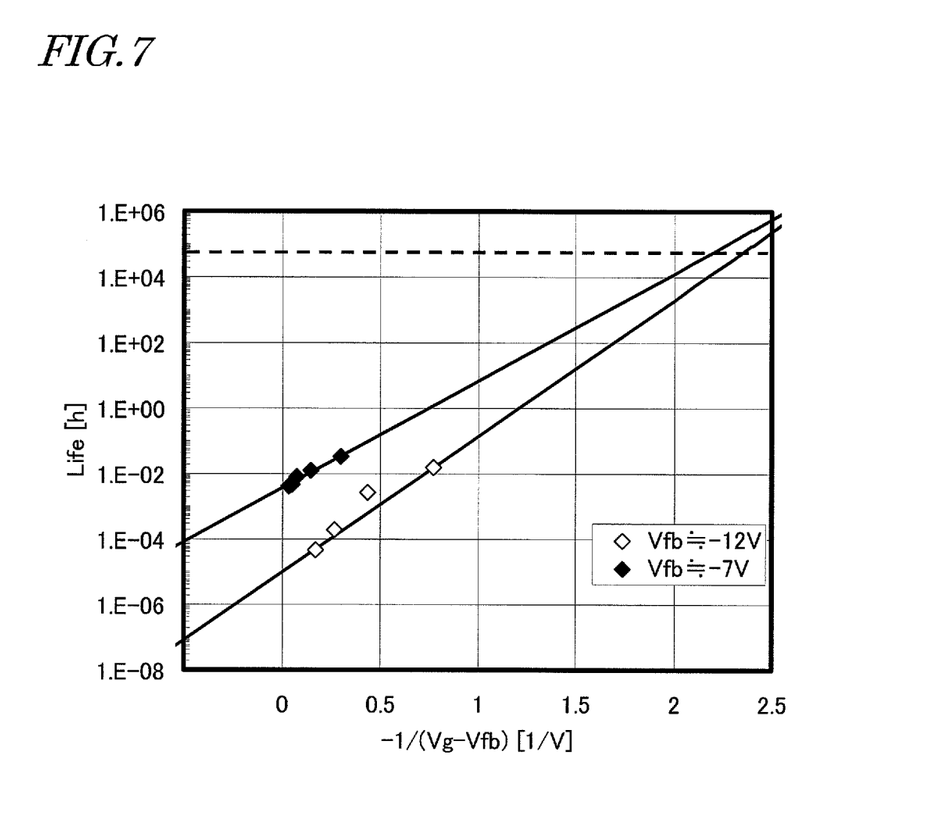

FIG. 7 shows voltage dependence of Vth lifetimes of lateral MISFETs having characteristics such that Vfb≈−7 V, −12 V, where a negative voltage (Vg) is applied. It can be estimated through extrapolation from the figure that Vg>Vfb−Vo must be satisfied in order to guarantee 10 years' of lifetime, and that the Vo value is approximately 0.4 V to 0.5 V, similarly to the case where Vfb-7 V. Although the constant Vo has a relatively small value above, it is not limited to the value estimated in the present embodiment.

Based on this new finding, in order to ensure that Vfb is equivalent to or less than the lower limit value Vgcc to −Vgcc/2) of the guaranteed range of operation, a number of specific constitutions described below may be adopted. Adopting such a specific constitution for the semiconductor device ensures reliability concerning Vth fluctuations within the guaranteed range of operation of the semiconductor device. Although the aforementioned experimental results pertain to lateral MISFETs, this is an analytical convenience; it must be noted that similar results have also been obtained with respect to vertical MISFETs.

A first specific constitution for realizing semiconductor device having Vfb as described above is that an impurity charge concentration Qb per area of the channel layer of the semiconductor device be equivalent to or more than Eg×Ci C/cm². The reason is that, by increasing Qb to a level which is equivalent to or more than Eg×Ci C/cm², Vfb will also have a negative shift which is equivalent to or more than 2Eg (unit: V), thus attaining a value not pertaining to conventional examples. Hereinafter, the reasons thereof will be described.

As described earlier, the value of not "Φms−Qf/Ci", i.e., a sum of the first term and second term on the right-hand side of eq. 1, is in a range of magnitude which is on the order of the band gap (Eg) of the semiconductor composing the MISFET.

In the case of SiC, as discussed above, the range which 4) ms may take is approximately from −3.2 V to 0.2 V. In the case of SiC, since the range which Qf/q may take is approximately from $3 \times 10^{11}/cm^2$ to $1 \times 10^{12}/cm^2$, the range of Qf/Ci is approximately from −3 V to −1 V. Therefore, the value of "Φms−Qf/Ci" will be approximately from −0.7Eg to Eg.

On the other hand, in the case of Si, as discussed above, the range which Φms may take is approximately from −1.1 V to 1.1 V. In the case of Si, since the range which Qf/q may take is approximately $3 \times 10^{10}/cm^2$ or below, the range of Qf/Ci is approximately from −0.1 V to 0. Therefore, the value of "Φms−Qf/Ci" will be approximately from −Eg to Eg.

When considering setting Vfb to a value which is lower than −2Eg, it is preferable that the following equation be satisfied.

$$Qb \geq (\Phi ms - Qf/Ci + 2Eg)Ci \qquad (eq.\ 2)$$

In the case of SiC, eq. 2 is transformed as follows by substituting −0.7Eg, which is the lower limit value of Φms−Qf/Ci.

$$Qb \geq 1.3 Eg \times Ci \qquad (eq.\ 3)$$

In the case of Si, eq. 2 is transformed as follows by substituting −Eg, which is the lower limit value of Φms−Qf/Ci.

$$Qb \geq Eg \times Ci \qquad (eq.\ 3)$$

From the above, by setting Qb to be Eg×Ci C/cm² or more, it becomes possible to set Vfb to a value which is lower than −2Eg. Moreover, in the case of SiC, it is preferable that Qb be 1.3Eg×Ci C/cm² or more. For example, when the charge concentration of a semiconductor impurity to be introduced in the channel layer 40 is set to 1.5Eg×Ci C/cm² in the present embodiment, the Vfb shift due to Qb in the third term in (eq. 1) is about −5 V, which is about 1.5 times that of the conventional example. If the conventional value of the first term and second term Φms−Qf/Ci of this equation, i.e., approximately −4 V, is added to this, Vfb will be about −9 V. This satisfies that the Vfb value be equivalent to or less than −Vgcc/2 in a semiconductor device whose Vgcc is about 18 V.

Furthermore, when the impurity to be introduced into the channel layer in the present embodiment is increased by 20% so that Qb=1.8Eg×Ci C/cm², the Vfb shift due to Qb will be about −6 V. This will result in a Vfb which is about −10 V, so that the Vfb value is equivalent to or less than −Vgcc/2 even when Vgcc is 20 V.

When the concentration of the semiconductor impurity to be introduced is increased to a level exceeding approximately $5 \times 10^{19}$ cm⁻³ the channel layer will degenerate such that depletion becomes very difficult, which departs from the objective of the present invention. Generally speaking, from the standpoint of step management and the like, the channel layer needs to have a thickness of about at least 10 nm. When the semiconductor impurity concentration is increased to a range exceeding $5 \times 10^{19}$ cm⁻³ mentioned above, the resultant Vfb shift will be approximately −160 V or even less in the case of the present embodiment, for example. Given the objective of the present invention, there is no need to reduce Vfb to that level. Moreover, since not much miniaturization is generally required in power semiconductor devices, it is considered that the disadvantages associated with the introduction of a channel layer, e.g., short channel effects, will be sufficiently controllable so long as Qb is within the aforementioned range.

A second specific constitution for realizing a semiconductor device having Vfb as described above is that a fixed charge density Qf associated with the gate insulating film of the semiconductor device be equivalent to or more than 1.5Eg×Ci C/cm². In the case where Φms−Qb/Ci is set to about 0.5Eg, what has been described with reference to eq. 2 to eq. 4 similarly applies when estimating the lower limit of a preferable range of fixed charge density Qf.

In accordance with the second term of (eq. 1), by increasing Qf to be equivalent to or more than 1.5Eg×Ci C/cm², which is a level not pertaining to conventional examples, Vfb will also have a shift which is equivalent to or more than 1.5Eg in the negative direction, thus attaining a Vfb value not pertaining to conventional examples.

In the present embodiment, even when setting the above Qf to be equivalent to or more than the aforementioned lower limit value, i.e., 1.5Eg×Ci C/cm², it is necessary to increase Qf to about $2.4 \times 10^{-7}$ C/cm², or about $1.5 \times 10^{12}/cm^2$ as expressed in a unit (Qf/q) which is obtained by dividing it by the elementary charge q. As described earlier, since reduction in Qf will directly enhance the performance and reliability of that semiconductor device, efforts to reduce Qf have been made in the past. Generally speaking, increasing Qf, e.g., even increasing Qf/q to be on the order of $10^{13}/cm^2$'s, is much easier than reducing Qf.

Another constitution for realizing a semiconductor device having Vfb as described above utilizes an effect of the work function difference Φms in the first term of (eq. 1). In order to allow Vfb to be negative-shifted by the shift amount illustrated in the present embodiment based only on the contribution of Φms, it is necessary for the gate electrode to have a smaller vacuum work function Φm, i.e., to be closer to the vacuum level. However, even the n⁺ polysilicon electrode of the conventional example has a Φm which is approximately 4.1 V; therefore, even if an electrode material whose Φm=0 (which is equal to the vacuum level) were discovered, the aforementioned limitations would exist in the Vfb shift amount in the negative direction that is attainable based only on changing Φms.

Therefore, what may be conceivable as a third specific constitution is combining an effect of Qf in the second term; i.e., the value of Qf−Φms×Ci be equivalent to or more than 2Eg×Ci C/cm². By this means, when an electrode having a smaller Φms is used, the smaller Φms makes it unnecessarily to increase Qf to excess, whereby the various aforementioned disadvantages which might occur by setting Qf at a high level would be alleviated.

Similarly, a fourth specific constitution is possible which combines an effect of Qb in the third term; i.e., the value of Qb−Φms×Ci be equivalent to or more than 2Eg×Ci C/cm². Based on this constitution, when an electrode having a smaller Φms is used, the smaller Φms makes it unnecessarily to increase Qb to excess, whereby the various aforementioned disadvantages which might occur by increasing Qb would be alleviated.

Finally, a semiconductor device is generally expected to be a Normally-OFF type (i.e., Vth>0 V in the n channel MISFET of the present embodiment), and in fact, most power semiconductors are Normally-OFF types. When the present invention is employed to allow Vfb to be negative-shifted to a value not pertaining to conventional examples, unless some measure is taken, there is a concern that Vth will also have a corresponding negative shift, possibly resulting in a Normally-ON type in some cases. However, according to an analytic expression of depletion approximation or the like, a commonly-used technique such as increasing the semiconductor impurity concentration in the semiconductor body region (which in the present embodiment is the p type body region 20) may be employed, for example, whereby Vth can be easily increased (i.e., shifted in the positive direction). Note that, within the bounds of an MIS type structure, the present technique is not only applicable to the present embodiment, but also is similarly applicable to the below-described embodiment.

Thus, the present invention has been described with respect to a preferred embodiment. Such descriptions do not define any limitations on the invention, and various modifications from the above-described embodiment are of course possible. For example, although an SiC semiconductor is illustrated above as an example, any other wide-band gap semiconductor may be used, or an Si semiconductor may be used. Although n channel MIS type semiconductor devices are mainly described above, p channel MISFETs are certainly encompassed. In this case, n and p semiconductor polarities, the positive and negative signs of voltage and the like, the higher (positive direction) and lower (negative direction) in the comparison of voltage and the like, hole- and electron-carriers, and so on, should be interpreted so that one replaces the other and vice versa, etc., as necessary. In this case, the Vth shift in question will be a shift in the positive direction due to electrons. It is expected that the degree of damage per electron, as expressed in trap efficiency, will be smaller than that per hole. However, in view of the increasingly-aggravated circumstances concerning semiconductor devices, the importance of the reliability problem concerning Vth fluctuations and the like and the significance of the present invention will not even slightly decrease for Si semiconductors, as well as SiC and the like for which a high-quality gate insulating film is difficult to obtain.

Second Embodiment

Next, with reference to FIG. 8, a semiconductor device 102 according to a second embodiment of the present invention will be described.

Figure 8:
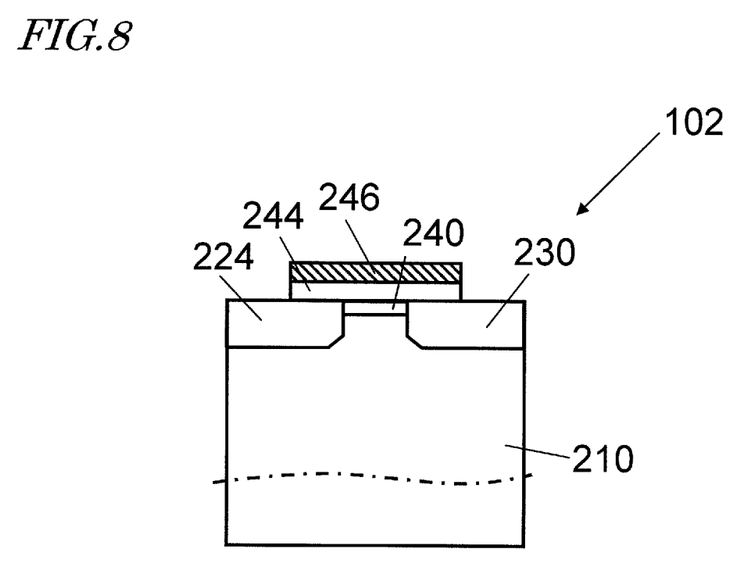

A semiconductor device 102 shown in FIG. 8 is an embodiment of the present invention as applied to a silicon (hereinafter Si) semiconductor device of an MIS structure, where an Si semiconductor substrate 210 is a p type, having a first semiconductor polarity. In a generic lateral MIS semiconductor device as in the present embodiment, the semiconductor substrate 210 corresponds to the so-called body region of the present invention. Between the body region (semiconductor substrate) 210 and a gate insulating film 244 formed thereon, a channel layer 240 having a second semiconductor polarity is formed, with a gate electrode 246 being formed on the gate insulating film 244. A source region 224 and a drain region 230 having the second semiconductor polarity are formed on the semiconductor substrate 210.

Although the first semiconductor polarity (conductivity type) is the p type and the second semiconductor polarity is the n type in the present embodiment, the n type and the p type may be reversed. Moreover, the present invention applies to any MIS type structure; other than an FET, the present invention is of course applicable to a so-called MIS capacitor, which lacks a source and a drain.

In the present embodiment, the gate insulating film 244 is composed of an insulating film material with a high dielectric constant, for example, and has an $SiO_2$-equivalent oxide thickness of 3.5 nm. As mentioned earlier, high-k dielectric insulating films, which are being introduced for gate insulating films in recent years, are not only much inferior in film quality to conventional thermal $SiO_2$ films, but generally have a small energy gap and a correspondingly low energy barrier as viewed from the carriers in the semiconductor, and thus are expected to worsen the reliability problems such as Vth fluctuations. The channel layer 240 is formed by ion implantation, for example, and has a semiconductor impurity concentration of $7.5 \times 10^{18}$ cm$^{-3}$ and a depth of 25 nm.

In order to obtain the effects of the present invention in the case where the gate insulating film thickness is so thin as in the present embodiment, it is necessary to increase the semiconductor impurity concentration in the channel layer 240 to somewhere in the latter half of the $10^{18}$ cm$^{-3}$'s. A channel layer 240 having such a high concentration may not be depleted across the entire channel layer 240. Even in such a case, the method described above in the first embodiment may be used to obtain a rough estimate of the space charge density Qb. For example, the depletion layer thickness Wm when Nb=$7.5 \times 10^{18}$ cm$^{-3}$ in the present embodiment is about 14 nm. Thus, Qb is about $17 \times 10^{-7}$ C/cm². Therefore, from (eq. 1), a shift amount in Vfb which is caused by Qb in the present embodiment is about −1.7 V.

Similarly to the first embodiment, in the lateral MOS embodiment shown in FIG. 8, too, the semiconductor impurity concentration in the body region and channel layer thereof refers to the semiconductor impurity concentration at a lateral position around the middle of both regions 224 and 230 which is sufficiently distant from the source region 224 and from the drain region 230.

In the present embodiment, n⁺ polysilicon is used for the gate electrode, and the semiconductor body region 210 has a semiconductor impurity concentration of $2 \times 10^{18}$ cm$^{-3}$.

Therefore, the work function difference Φms is about −1.1 V. Moreover, the shift amount in Vfb which is caused by Qb is approximately in the range from 0 V to −0.1 V. On the other hand, as has been described earlier, conventional Qb/Ci values are generally kept at about the band gap of the semiconductor or less. Therefore, when the above exemplary values are substituted into the right-hand side of (eq. 1), the Vfb of the conventional example is equivalent to or more than −2.2 V.

In a semiconductor device of minute dimensions as contemplated by the present embodiment, the gate rating Vgcc is 1.8 V, for example. Since the band gap Eg of Si is about 1.1 V, in the case of the present embodiment, the lower one of −2Eg and the lower limit value of the guaranteed range of operation, i.e., −Vgcc/2, is −2Eg.

Based on the findings described in the first embodiment, adopting a number of specific constitutions described in the first embodiment also in an Si semiconductor so that Vfb has a value equivalent to or less than −2Eg not pertaining to conventional examples, it becomes possible to ensure reliability concerning Vth shifts within the guaranteed range of operation of the semiconductor device.

A first specific constitution for realizing a semiconductor device having Vfb as described above is that an impurity charge concentration Qb per area of the channel layer of the semiconductor device be equivalent to or more than Eg×Ci C/cm². The reason is that, by increasing Qb to a level which is equivalent to or more than Eg×Ci C/cm², which is a level not pertaining to conventional examples, Vfb will also have a negative shift so as to be equivalent to be less than −2Eg, which is a low value not pertaining to conventional examples.

For example, even when the charge concentration of a semiconductor impurity to be introduced into the channel layer 240 is set to 1.5Eg×Ci C/cm² in the present embodiment, the Vfb shift due to Qb in the third term of (eq. 1) is about −1.6 V, which is about 1.5 times that of the conventional example. If the conventional value of the first term and second term Φms−Qf/Ci of this equation, i.e., approximately −1.1 V, is added to this, Vfb will be about −2.7 V, thus satisfying that Vfb be equivalent to or less than −2Eg.

Alternatively, a second specific constitution for realizing a semiconductor device having Vfb as described above is that the fixed charge density Qf associated with the gate insulating film of the semiconductor device be equivalent to or more than 1.5Eg×Ci C/cm². In accordance with the second term of (eq. 1), by increasing Qf to be equivalent to or more than 1.5Eg×Ci C/cm², which is a level not pertaining to conventional examples, Vfb will also have a shift which is equivalent to or more than 1.5Eg in the negative direction, thus attaining a Vfb value not pertaining to conventional examples. For example, even when setting the above Qf in the present embodiment to be equivalent to or more than the aforementioned lower limit value of concentration, i.e., 1.5Eg×Ci C/cm², it is necessary to increase Qf to about $16 \times 10^{-7}$ C/cm², or approximately $10^{13}$/cm² as expressed in a unit (Qf/q) which is obtained by dividing it by the elementary charge q. As described earlier, in Si semiconductors, the ability to use a thermal $SiO_2$ film for the gate insulating film thereof has allowed Qf to be reduced to below $10^{11}$/cm² as expressed in a unit (Qf/q) which is obtained by dividing it by the elementary charge q. However, such a level of Qf/q reduction is generally difficult when it is replaced by a high-k dielectric gate insulating film, as is the case in these years, and the current norm stands around the middle of $10^{11}$/cm²'s (roughly speaking, about 3 to $5 \times 10^{11}$/cm²). Since it is directly connected to the general performance and reliability of the semiconductor device, reduction of Qf is a generally known matter, and no motivation has usually existed beyond the various disadvantages which will occur by daring to choose a high level of Qf, or, such a concept in itself has never existed. However, as a constitution for obtaining the outstanding effects illustrated by the present invention, Qf is conversely increased to a level not pertaining to conventional examples. Generally speaking, increasing Qf, e.g., even increasing Qf/q to be on the order of $10^{13}$/cm²'s, is much easier than reducing Qf.

Alternatively, another constitution for realizing a semiconductor device having Vfb as described above utilizes an effect of the work function difference Φms in the first term of (eq. 1). In order to allow Vfb to be negative-shifted by the shift amount illustrated in the present embodiment based only on the contribution of Φms, it is necessary for the gate electrode to have a smaller vacuum work function Φm, correspondingly by approximately 1 V, i.e., to be closer to the vacuum level. However, as described earlier, most of the practical gate electrode materials, including the n⁺ polysilicon electrode of the conventional example, have a vacuum work function which is generally in the range from 4 V to 5.3 V, and most of them fall within the band gap of Si or in a range which does not deviate much therefrom. Therefore, the aforementioned limitations exist in the Vfb shift amount in the negative direction that is attainable based only on changing Φms.

Therefore, what may be conceivable as a third specific constitution is combining an effect of Qf in the second term; i.e., the value of Qf−Φms×Ci be equivalent to or more than 2Eg×Ci C/cm². Based on this constitution, when an electrode having a smaller Φms is used, the smaller Φms makes it unnecessarily to increase Qf to excess, whereby the various aforementioned disadvantages which might occur by setting Qf at a high level would be alleviated.

Similarly, a fourth specific constitution is possible which combines an effect of Qb in the third term; i.e., the value of Qb−Φms×Ci be equivalent to or more than 2Eg×Ci C/cm². Based on this constitution, when an electrode having a smaller Φms is used, the smaller Φms makes it unnecessarily to increase Qb to excess, whereby the various aforementioned disadvantages which might occur by increasing Qb would be alleviated.

Thus, the present invention has been described with respect to a preferred embodiment. Such descriptions do not define any limitation on the invention, and various modifications from the above-described embodiment are of course possible. For example, although an Si semiconductor is illustrated above as an example, a SiC semiconductor may be used, or any other wide-band gap semiconductor may be used. Although n channel MIS type semiconductor devices are mainly described in the above embodiment, the present invention is also applicable to p channel MISFETs. In this case, n and p semiconductor polarities, the positive and negative signs of voltage and the like, the higher (positive direction) and lower (negative direction) in the comparison of voltage and the like, hole- and electron-carriers, and so on, should be interpreted so that one replaces the other and vice versa, etc., as necessary.

A method for driving the semiconductor device of each of the above embodiments includes a step of applying a voltage of a magnitude between Vth and Vgcc⁻ to the gate electrode, and a step of applying a voltage of a magnitude between Vth and Vgcc to the gate electrode, characterized in that Vfb of the semiconductor device is equivalent to or less than Vgcc⁻. According to this driving method, even if a voltage of a magnitude which is the lower limit of the guaranteed range is applied to the gate electrode, since Vfb is set to be lower than the lower limit of the guaranteed range of operation, the value obtained by subtracting Vfb from the gate voltage never becomes positive, whereby Vth fluctuations are suppressed.

In the method for driving the semiconductor device of each of the above embodiments, it is preferable that Vfb of the semiconductor device is equivalent to or less than the lower one of −Vgcc/2 and −2Eg.

INDUSTRIAL APPLICABILITY

The present invention is suitably used for power MOSFETs, and various control devices and driving devices in which a power MOSFET is used, for example.

REFERENCE SIGNS LIST 10,110,210 substrate (semiconductor substrate)
11,111 first semiconductor layer (drift layer)
20,120 body region (well region)
22,122 contact region
24,124,224 source region
26,126 source electrode
28,128 drain electrode
30,230 drain region
40,140,240 channel layer (buried layer, channel epitaxial layer)
42 channel region
44,144,244 gate insulating film
46,146,246 gate electrode
100 semiconductor device
101 lateral SiC-MISFET
102 semiconductor device
1100 semiconductor device

The invention claimed is:

1. A semiconductor device of an MIS type, comprising:
a semiconductor body region;
a gate insulating film;
a channel layer provided between the semiconductor body region and the gate insulating film, the channel layer having an opposite semiconductor polarity to that of the semiconductor body region; and
a gate electrode provided so as to be in contact with the gate insulating film, wherein,
a gate voltage at which a band bending of the semiconductor body region becomes zero is defined as a flatband voltage Vfb, and a rated voltage for a gate of the semiconductor device with respect to an OFF-polarity is defined as Vgcc⁻, such that
Vfb of the semiconductor device is equivalent to or less than Vgcc⁻.

2. The semiconductor device of claim 1, wherein,
a band gap of the semiconductor body region is defined as Eg, and a rated voltage for the gate of the semiconductor device with respect to an ON-polarity is defined as Vgcc, such that
Vfb of the semiconductor device is equivalent to or less than a lower one of −Vgcc/2 and −2Eg.

3. The semiconductor device of claim 2, wherein,
a gate insulating film capacitance of the semiconductor device is defined as Ci, such that
the channel layer has a semiconductor impurity concentration which is greater than $10^{18}$ cm$^{-3}$ but equal to or less than $5\times10^{19}$ cm$^{-3}$, and a semiconductor impurity charge concentration per area which is equivalent to or more than Eg×Ci [C/cm²].

4. The semiconductor device of claim 2, wherein,
a gate insulating film capacitance of the semiconductor device is defined as Ci, and a fixed charge density associated with the gate insulating film is defined as Qf, such that
Qf is equivalent to or more than 1.5Eg×Ci [C/cm²].

5. The semiconductor device of claim 2, wherein,
a gate insulating film capacitance of the semiconductor device is defined as Ci, a fixed charge density associated with the gate insulating film is defined as Qf, and a work function difference between the semiconductor body region and the gate electrode is defined as φms, such that
Qf−φms×Ci has a value which is equivalent to or more than 2Eg×Ci [C/cm²].

6. The semiconductor device of claim 2, wherein,
a gate insulating film capacitance of the semiconductor device is defined as Ci, a semiconductor impurity charge concentration of the channel layer per area is defined as Qb, and a work function difference between the semiconductor body region and the gate electrode is defined as φms, such that
the channel layer has a semiconductor impurity concentration which is greater than $10^{18}$ cm$^{-3}$ but equal to or less than $5\times10^{19}$ cm$^{-3}$, and Qb−φms×Ci has a value which is equivalent to or more than 2Eg×Ci [C/cm²].

7. The semiconductor device of claim 1, wherein the semiconductor body region and the channel layer are composed of silicon carbide.

8. The semiconductor device of claim 7, wherein Vfb is equal to or less than −10 volts.

9. A driving method for a semiconductor device of an MIS type having a semiconductor body region, a gate insulating film, a channel layer provided between the semiconductor body region and the gate insulating film, the channel layer having an opposite semiconductor polarity to that of the semiconductor body region, and a gate electrode provided so as to be in contact with the gate insulating film, the driving method comprising:
a step of applying a voltage of a magnitude between Vth and Vgcc⁻ to the gate electrode,
where a gate voltage at which a band bending of the semiconductor body region becomes zero is defined as flatband voltage Vfb, a rated voltage for a gate of the semiconductor device with respect to an OFF-polarity is defined as Vgcc⁻, a rated voltage for the gate of the semiconductor device with respect to an ON-polarity is defined as Vgcc, and a threshold voltage of the semiconductor device is defined as Vth; and
a step of applying a voltage of a magnitude between Vth and Vgcc to the gate electrode, wherein
Vfb of the semiconductor device is equivalent to or less than Vgcc⁻.

10. The driving method for a semiconductor device of claim 9, wherein,
a band gap of the semiconductor body region is defined as Eg, such that
Vfb of the semiconductor device is equivalent to or less than a lower one of −Vgcc/2 and −2Eg.

* * * * *